(12) United States Patent
Ju et al.

(10) Patent No.: US 8,049,319 B2
(45) Date of Patent: Nov. 1, 2011

(54) ULTRA WIDEBAND SYSTEM-ON-PACKAGE

(75) Inventors: In-Kwon Ju, Daejon (KR); In-Bok Yom, Daejon (KR); Ho-Jin Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 124 days.

(21) Appl. No.: 12/604,354

(22) Filed: Oct. 22, 2009

(65) Prior Publication Data
US 2010/0102425 A1  Apr. 29, 2010

(30) Foreign Application Priority Data

Oct. 24, 2008 (KR) .................. 10-2008-0104872
Dec. 22, 2008 (KR) .................. 10-2008-0131439

(51) Int. Cl.
H01L 23/02 (2006.01)
H01L 23/053 (2006.01)
H01L 23/12 (2006.01)
H01L 23/34 (2006.01)

(52) U.S. Cl. . 257/685; 257/700; 257/723; 257/E25.005; 257/E25.01; 257/E25.011; 257/E25.012; 257/E25.015; 257/E25.016; 257/E25.02; 257/E25.023; 257/E25.025; 257/E25.026

(58) Field of Classification Search .................. 257/685, 257/700, 723, E25.005, E25.01, E25.011, 257/E25.012, E25.015, E25.016, E25.02, 257/E25.023, E25.025, E25.026
See application file for complete search history.

(56) References Cited

U.S. PATENT DOCUMENTS

| 6,876,056 | B2 * | 4/2005 | Tilmans et al. | 257/528 |
| 6,936,913 | B2 | 8/2005 | Akerling et al. | |
| 7,119,425 | B2 * | 10/2006 | Jeong et al. | 257/685 |
| 7,531,905 | B2 * | 5/2009 | Ishino et al. | 257/777 |
| 7,622,327 | B2 * | 11/2009 | Chrysler et al. | 438/106 |
| 7,727,807 | B2 * | 6/2010 | Han | 438/109 |
| 7,727,887 | B2 * | 6/2010 | Christensen et al. | 438/637 |
| 7,786,563 | B1 * | 8/2010 | Hoang et al. | 257/686 |
| 7,804,688 | B2 * | 9/2010 | Wakabayashi et al. | 361/714 |
| 7,838,967 | B2 * | 11/2010 | Chen | 257/621 |
| 7,868,462 | B2 * | 1/2011 | Choi et al. | 257/777 |
| 2006/0291110 | A1 * | 12/2006 | Kanno et al. | 361/18 |
| 2007/0177357 | A1 * | 8/2007 | Wakabayashi et al. | 361/719 |
| 2007/0231970 | A1 * | 10/2007 | Fukuo et al. | 438/127 |
| 2007/0285211 | A1 * | 12/2007 | Kim et al. | 340/10.1 |
| 2008/0142935 | A1 * | 6/2008 | Montoriol et al. | 257/666 |

(Continued)

OTHER PUBLICATIONS

Ki Seok Yang et al., "Low-Loss Integrated-Waveguide Passive Circuits Using Liquid-Crystal Polymer System-on-Package (SOP) Technology for Millimeter-Wave Applications", IEEE Transactions on Microwave Theory and Techniques, Dec. 2006, pp. 4572-4579, vol. 54, No. 12.

(Continued)

Primary Examiner — Ida M Soward

(57) ABSTRACT

This research discloses an ultra wideband system-on-package (SoP). The SoP includes a package body; a first integrated circuit mounted on the package body; a first signal transmission unit connected to the first integrated circuit; a signal via connected to the first signal transmission unit and including a slab line and a trough line; and a second signal transmission unit connected to the signal via. The technology of the present research can transmit ultra broadband signals by minimizing discontinuity of signals appearing during vertical transition that occurs in the course of a signal transmission to/from an external circuit, and a fabrication method thereof.

7 Claims, 7 Drawing Sheets

U.S. PATENT DOCUMENTS

| | | | |
|---|---|---|---|
| 2008/0157284 A1* | 7/2008 | Chang et al. | 257/620 |
| 2008/0185718 A1* | 8/2008 | Suh et al. | 257/737 |
| 2008/0203554 A1* | 8/2008 | Nishio et al. | 257/686 |
| 2009/0034206 A1* | 2/2009 | Lu et al. | 361/718 |
| 2009/0129422 A1* | 5/2009 | Edris et al. | 372/50.124 |
| 2009/0180225 A1* | 7/2009 | Pan et al. | 361/56 |
| 2009/0219668 A1* | 9/2009 | Hsu et al. | 361/303 |
| 2010/0135611 A1* | 6/2010 | Asai et al. | 385/14 |
| 2010/0314714 A1* | 12/2010 | Nakamura | 257/531 |

OTHER PUBLICATIONS

Inkwon Ju et al., "High Performance Vertical Transition from DC to 70 GHz for System-on-Package Applications", Proceedings of the 38th European Microwave Conference, Oct. 30, 2008, pp. 1338-1341, EuMA, Amsterdam, The Netherlands.

* cited by examiner

ULTRA WIDEBAND SYSTEM-ON-PACKAGE

CROSS-REFERENCES TO RELATED APPLICATIONS

The present invention claims priority of Korean Patent Application Nos. 10-2008-0104872 and 10-2008-0131439, filed on Oct. 24, 2008, and Dec. 22, 2008, respectively, which is (are) incorporated herein by reference in their entirety.

BACKGROUND OF THE INVENTION

1. Field of the Invention

The present invention relates to an ultra wideband system-on-package.

2. Description of Related Art

With dramatic progress in Information Technology (IT), such as mobile communication, semiconductor and network, there are explosively increasing demands for the market demands for IT convergence products, which include diverse functions, e.g., mobile communication, data communication, multimedia, and games, integrated therein. The IT-convergence products necessarily require System-on-Package (SoP) technology, which converges a plurality of constituent parts of diverse functions into one package.

According to the SoP technology, a system is realized as a single package by forming a passive device built in a substrate and stacking an active device on a substrate. This is to integrate conventional constituent parts that have been already developed as hardware semiconductor design intellectual properties (IP), such as a semiconductor substrate, a passive device, a filter, an antenna, and a battery, in the inside of a three-dimensional (3D) package. The SoP technology can realize a product without any structural and procedural modification in an already developed chip. Therefore, the SoP technology is advantageous in that it can be realized more easily and it takes less time to be developed than System-on-Chip (SoC) technology of a horizontal structure, which realizes tens of thousands of different active and passive devices through a single silicon process.

Recent development of ultrahigh frequency application area such as millimeter wave vehicle anti-collision radar and millimeter wave Wireless Personal Area Networking (WPAN) requires an ultra wideband SoP that can transmit ultra broadband signals.

SUMMARY OF THE INVENTION

An embodiment of the present invention is directed to providing an ultra wideband System-on-Package (SoP) that can transmit ultra broadband signals by minimizing discontinuity of signals appearing during vertical transition that occurs in the course of a signal transmission to/from an external circuit, and a fabrication method thereof.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided a System-on-Package, which includes: a package body; a first integrated circuit mounted on the package body; a first signal transmission unit connected to the first integrated circuit; a signal via connected to the first signal transmission unit and including a slab line and a trough line; and a second signal transmission unit connected to the signal via.

In accordance with another aspect of the present invention, there is provided a method for fabricating a System-on-Package, which includes: providing a package body; mounting a first integrated circuit on the package body; connecting the first integrated circuit to the first signal transmission unit; connecting a signal via including a slab line and a trough line to the first signal transmission unit; and connecting the signal via to the second signal transmission unit.

DESCRIPTION OF SPECIFIC EMBODIMENTS

Figure 1:
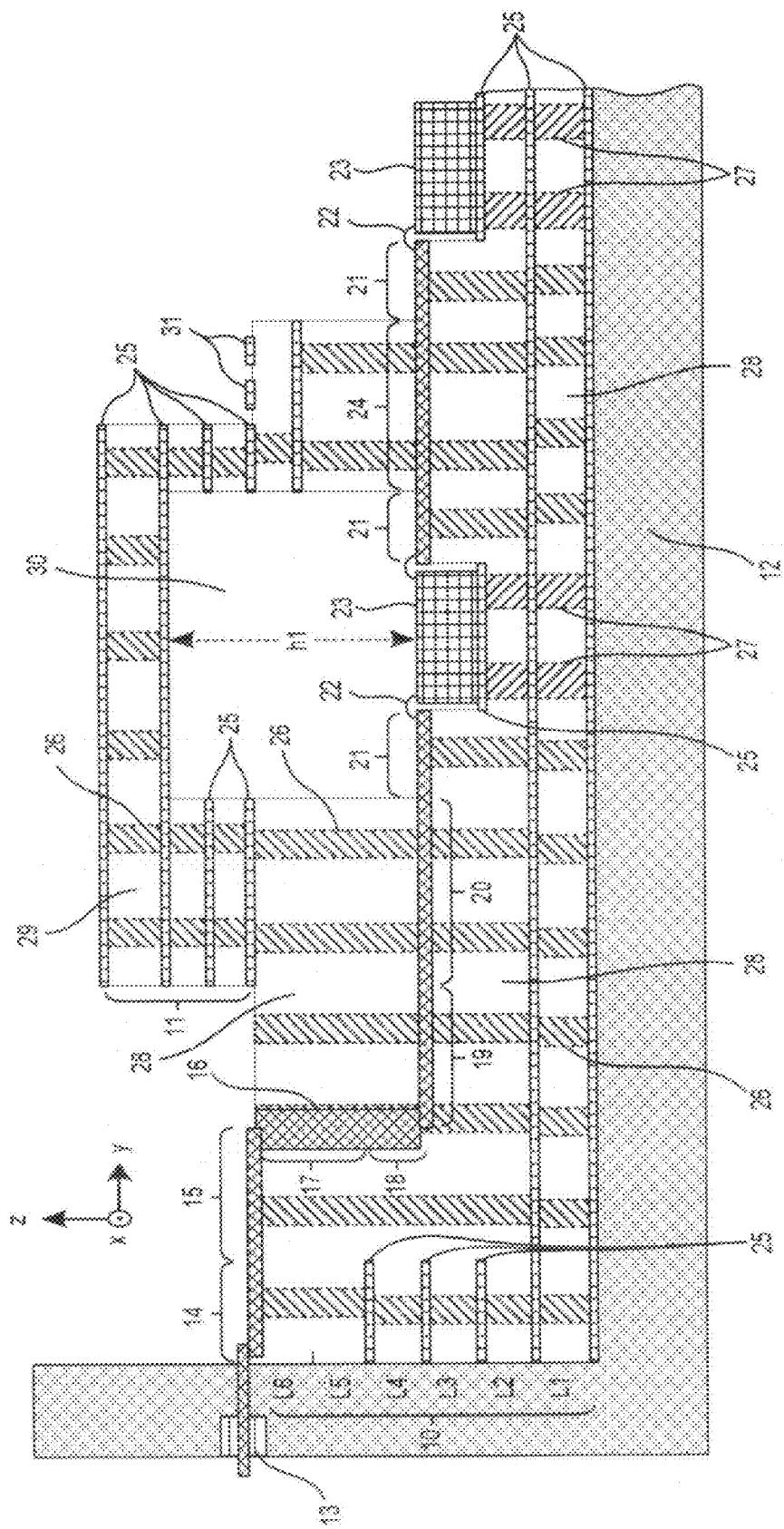
FIG. 1 illustrates a structure of a System-on-Package (SoP) in accordance with an embodiment of the present invention.

The advantages, features and aspects of the invention will become apparent from the following description of the embodiments with reference to the accompanying drawings, which is set forth hereinafter. When it is considered detailed description on a prior art may obscure a point of the present invention, the description will be omitted. The same reference numerals are given to the same or similar constituent elements although they appear in different drawings.

Recent increase in the use of ultrahigh frequency signals in a variety of electronic devices requires the development of a System-on-Package (SoP), which uses the ultrahigh frequency. In the past, there was an attempt to realize an SoP for millimeter wave by using ultrahigh frequency integrated waveguide. The conventional method, however, limits its used frequency to millimeter wave and since it is disadvantageous in that it cannot transmit signals of frequency lower than millimeter wave, the conventional method is inappropriate as an ultra wideband SoP.

The present invention relates to an ultra wideband SoP using ultrahigh frequency, and provides an ultra wideband SoP having a vertical transition structure with low signal loss during signal transmission, and a fabrication method thereof.

According to an embodiment of the present invention, an integrated circuit mounted on a package body includes a signal transmission unit and a signal via connected to the signal transmission unit. The signal via is formed of a trough line and a slab line to thereby minimize a signal discontinuity which occurs in the vertical transition. The signal transmitter is formed of a shielded multilayer coplanar waveguide (SM-CPW) line so that it could reduce radiation loss and crosstalk which may occur during the signal transmission. The signal via is connected to the signal transmission unit in the form of a half-square via pad. The half-square via pad form has an effect of decreasing undesirable coupling among signal transmission units.

Hereafter, specific embodiments of the present invention will be described in detail with reference to the accompanying drawings.

FIG. 1 illustrates a structure of a System-on-Package (SoP) in accordance with an embodiment of the present invention. Referring to FIG. 1, the SoP includes a package body 10, a package cover 11, and an integrated circuit 23. The integrated circuit 23 may be a Monolithic Microwave Integrated Circuit (MMIC), an optical integrated circuit (IC), or a digital IC, but the integrated circuit 23 of the present invention is not limited to it. The integrated circuit 23 includes a heatproof via 27 in the lower part to take a sufficient protection against heat generated in the integrated circuit 23.

Meanwhile, the package body 10 and the package cover 11 are filled with dielectric substances 28 and 29 having a high dielectric rate, respectively.

The package body 10 is mounted on a housing 12, and connected to a circuit outside the SoP through a coaxial connector bead 13 to transmit/receive signals to/from the external circuit. The package cover 11 is positioned in the upper part of the integrated circuit 23 and forms a cavity where the integrated circuit 23 is to be mounted. The cavity shields the integrated circuit 23 from electromagnetic interference and hermetically seals and protects the integrated circuit 23 from an exterior environment. The package body 10 and the package cover 11 may be formed of multiple dielectric layers. Referring to FIG. 1, the package body 10 includes multiple dielectric layers L1 and L6. The package cover 11 is also formed of multiple layers and it may be plated.

The integrated circuit 23 is connected to an external circuit through first signal transmission units 19, 20 and 21, a signal via 16, second signal transmission units 14 and 15, and a third signal transmission unit formed of a coaxial connector bead, and transmits/receives signals to/from the external circuit.

The integrated circuit 23 is first connected to a grounded coplanar waveguide (GCPW) line 21 through a joining means 22 such as wire bonding or ribbon bonding. The GCPW line 21 is connected to an SMCPW line 20, which is connected to an SMCPW line 19. The radiation loss and crosstalk appearing in the course of signal transmission may be decreased by using the SMCPW 19 and 20.

The SMCPW line 19 is connected to the signal via 16. Herein, the SMCPW line 19 is connected in the form of a half-square via pad, which will be described later on. The signal via 16 includes a slab line 17 and a trough line 18. Vertical transition of a signal between the external circuit and the integrated circuit 23 occurs through the signal via 16. Herein, signal discontinuity occurring from the vertical transition may be minimized by forming the signal via 16 of the slab line 17 and the trough line 18, as illustrated in FIG. 1.

The other end of the signal via 16 is connected to the second signal transmission units 14 and 15. Just as the signal via 16 is connected to the SMCPW line 19, the signal via 16 is also connected to a GCPW line 15 of the second signal transmission units 14 and 15 in the form of a half-square via pad. The GCPW line 15 is connected to another GCPW line 14. The GCPW line 14 is also connected to the coaxial connector bead 13 to transmit a signal to the exterior.

Figure 2:
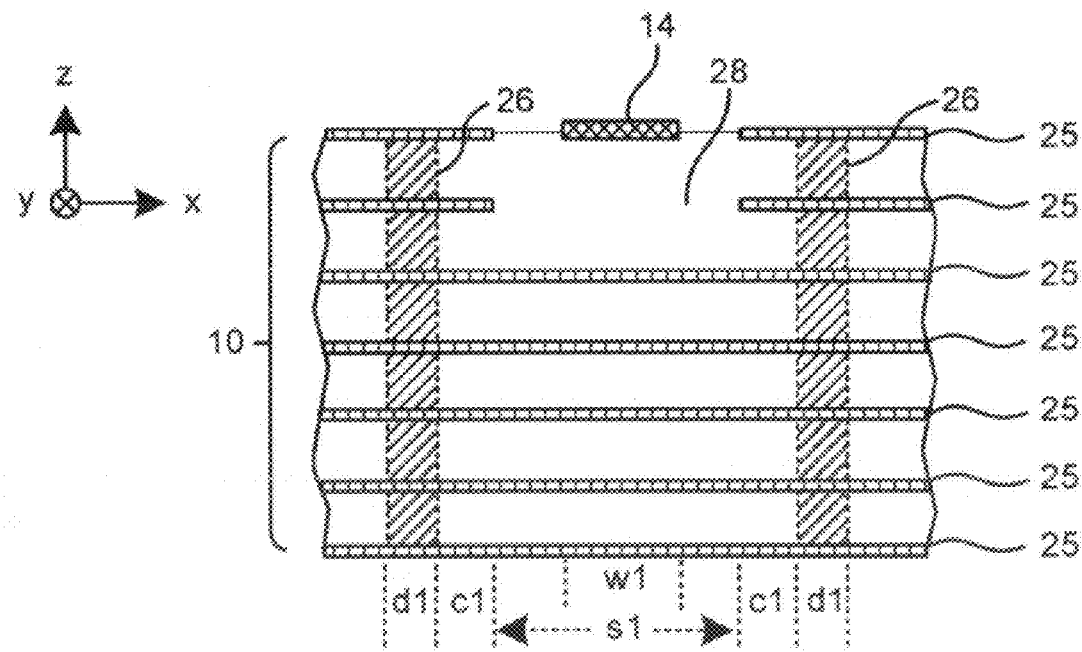
FIG. 2 illustrates a structure of a GCPW line 14 of second signal transmission units of the SoP in accordance with an embodiment of the present invention.
Figure 3:
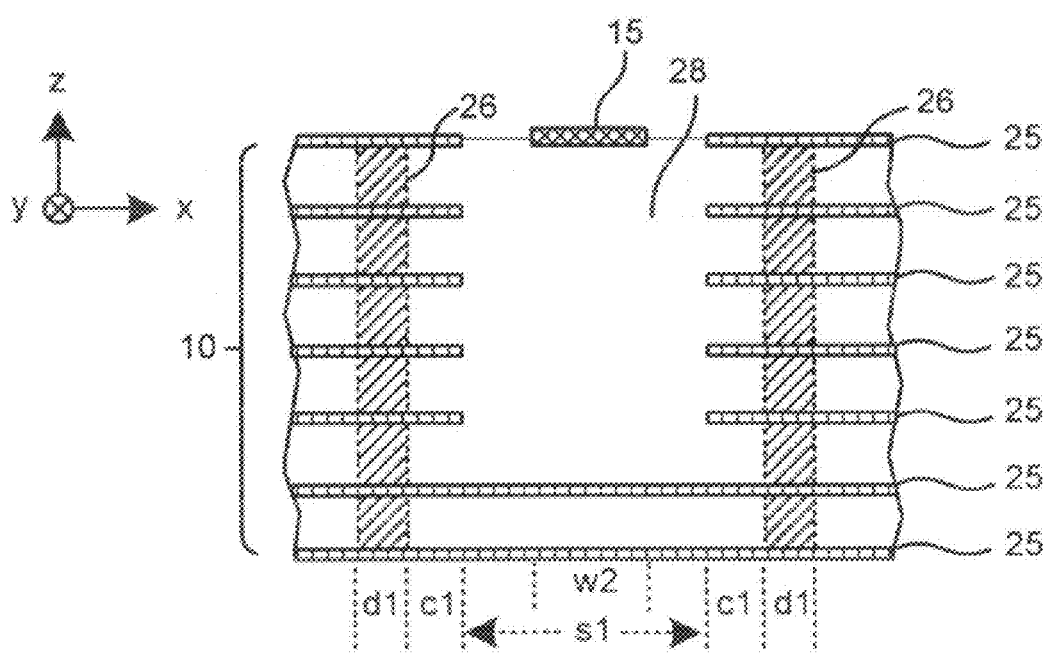
FIG. 3 illustrates a structure of a GCPW line 15 of the second signal transmission units of the SoP in accordance with an embodiment of the present invention.

FIG. 2 illustrates a structure of a GCPW line 14 of second signal transmission units of the SoP in accordance with the embodiment of the present invention, and FIG. 3 illustrates a structure of the GCPW line 15 of the second signal transmission units of the SoP in accordance with the embodiment of the present invention.

Referring to FIGS. 2 and 3, a structure where the lower part of a line is filled with a dielectric substance 28 having a high dielectric rate with grounds 25 and 26 around the dielectric substance 28 and the upper part of the line contacts air, which is different from the dielectric substance 28, is referred to as a GCPW line structure. Meanwhile a line shown in FIG. 8 also has the same structure, which is the GCPW line structure.

The GCPW lines 14 and 15 serve as transmission lines connecting an external circuit with the vertical transition inside the SoP. Referring to FIGS. 2 and 3, the line widths of the GCPW lines 14 and 15 are w1 and w2, respectively, and the distance between side ground surfaces is the same, which is s1. The reason the GCPW lines 14 and 15 have different line widths w1 and w2 is that the distances to the lower part ground surfaces are different from each other.

Figure 4:
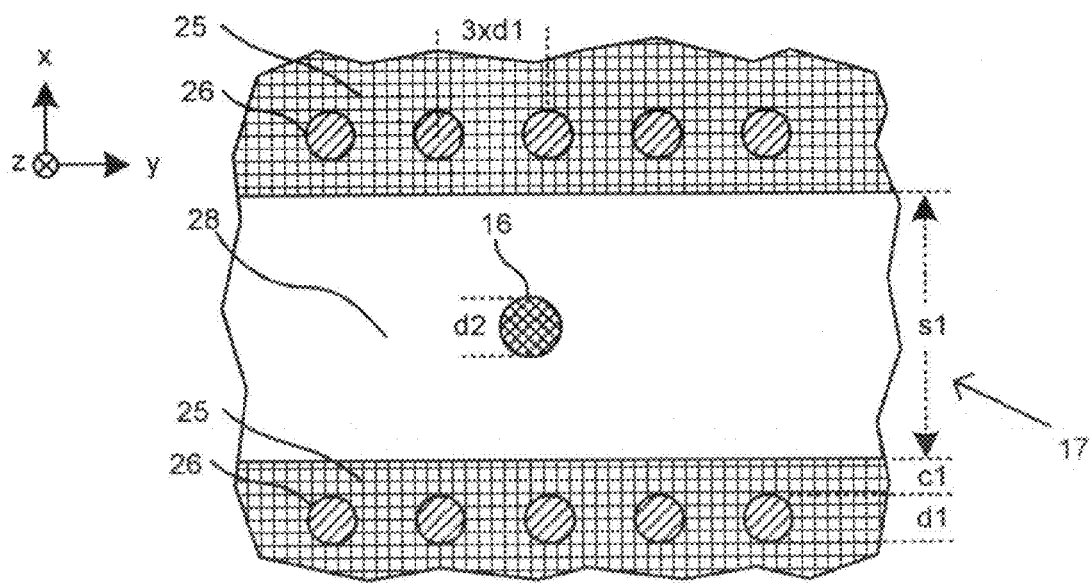
FIG. 4 illustrates a structure of a slab line 17 of the SoP in accordance with the embodiment of the present invention.
Figure 5:
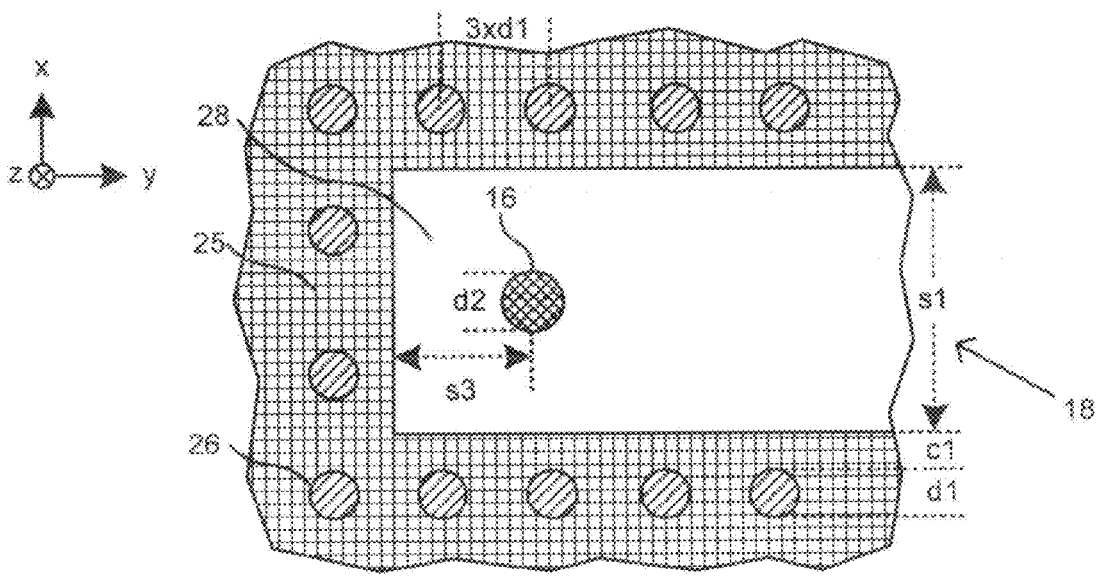
FIG. 5 illustrates a structure of a trough line 18 of the SoP in accordance with the embodiment of the present invention.

FIG. 4 illustrates a structure of a slab line 17 of the SoP in accordance with the embodiment of the present invention. FIG. 5 illustrates a structure of a trough line 18 of the SoP in accordance with the embodiment of the present invention.

Referring to FIG. 4, the surrounding area of the signal via 16 is filled with the dielectric substance 28, and the grounds 25 and 26 are formed in parallel on the same plane around the dielectric substance 28. This structure is referred to as a slab line 17. Referring to FIG. 5, the surrounding area of the signal via 16 is filled with the dielectric substance 28, and the grounds 25 and 26 are formed on the same plane around the dielectric substance 28 in the shape of a horse trough, or a shape of ' ⊏ '. This structure is referred to as a trough line 18.

As illustrated in FIGS. 4 and 5, the slab line 17 and the trough line 18 include the signal via 16 and grounds. The grounds include a ground surface 25 and a ground via 26. In FIG. 1, the trough line 18 corresponds to an L4 layer, and the slab line 17 corresponds to L5 and L6 layers. The characteristic impedances of the trough line 18 and the slab line 17 are expressed as the following Equations 1 and 2, respectively.

$$Z_0 = \frac{138}{\sqrt{\varepsilon_r}} \log\left(1.17 \times \frac{s1}{d2}\right)(\Omega) \quad \text{Eq. 1}$$

$$Z_0 = \frac{138}{\sqrt{\varepsilon_r}} \log\left(\frac{4 \times s1}{\pi \times d2}\right)(\Omega) \quad \text{Eq. 2}$$

where d2 denotes the diameter of the signal via 16; d1 denotes the diameter of the ground via 26; c1 denotes the distance between the ground via 26 and an end of the ground surface 25; and s1 denotes the distance between the ground surfaces 25.

The pitch between the ground vias 26 is three times the d1, which is 3×d1, and the distance s1 between the ground surfaces 25 is two times s3 shown in FIG. 5.

Vertical transition occurs through the signal via and the slab line 17 and the trough line 18 are applied to the signal via 16. The technology of the present invention minimizes discontinuity of the vertical transition occurring when a conventional via hole is used and thereby fabricate a SoP having a low signal loss characteristics. According to conventional technology, the grounds shown in FIGS. 4 and 5 are not formed around the signal via 16 and the signal via 16 functions as an inductor. In this case, high frequency signals hardly pass through the signal via 16. Also, the conventional technology has an increased insertion loss and a degraded return loss. However, when grounds are disposed around the signal via 16, which is shown in the slab line 17 and the trough line 18 of the embodiment of the present invention, the characteristic impedance of a transmission line passing through the signal via 16 may be matched and this minimizes the discontinuity of the vertical transition, which occurs according to the present invention.

Figure 6:
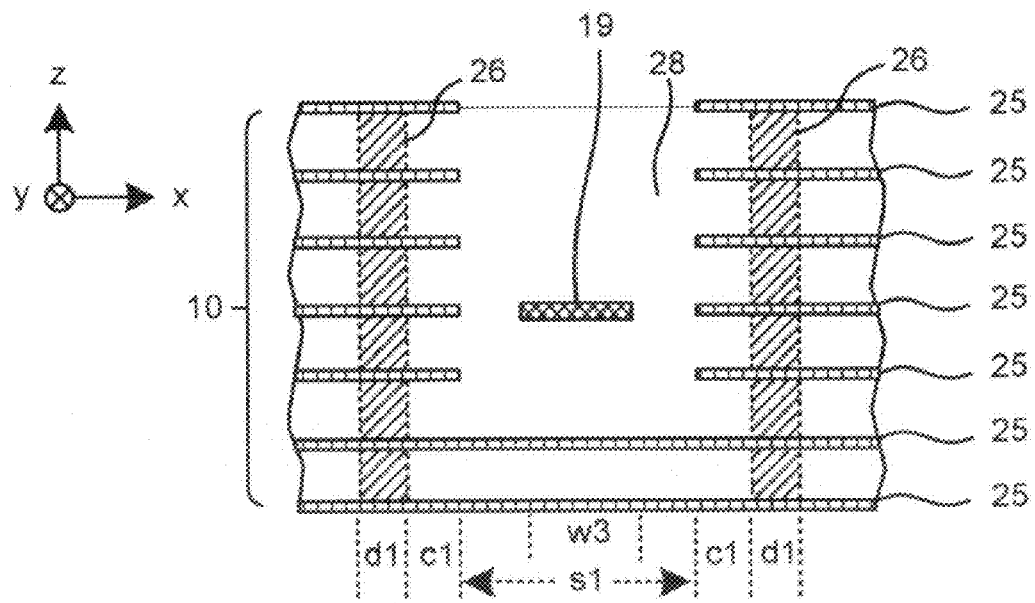
FIG. 6 illustrates a structure of an SMCPW line 19 of a first signal transmission unit of the SoP in accordance with the embodiment of the present invention.
Figure 7:
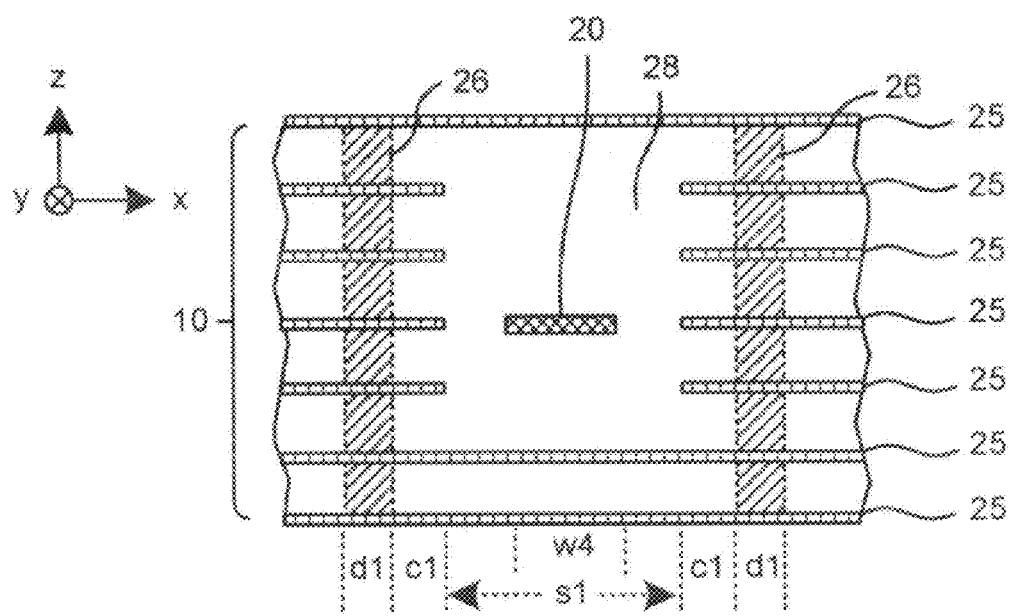
FIG. 7 illustrates a structure of an SMCPW line 20 of the first signal transmission unit of the SoP in accordance with the embodiment of the present invention.

FIG. 6 illustrates a structure of an SMCPW line 19 of a first signal transmission unit of the SoP in accordance with the embodiment of the present invention. FIG. 7 illustrates a structure of an SMCPW line 20 of the first signal transmission unit of the SoP in accordance with the embodiment of the present invention.

Referring to FIGS. 6 and 7, the dielectric substance 28 fills the area around a line, and the grounds 25 and 26 are formed around the dielectric substance 28. This structure is referred to as an SMCPW line structure.

The SMCPW line 19 of FIG. 6 and the SMCPW line 20 of FIG. 7 are shielded structures surrounded by the ground surfaces 25 and the ground vias 26. In this structure, an electromagnetic field is formed between the bottom surface adjacent to the line and the ground surfaces on both sides. Since the upper part of the SMCPW lines 19 and 20 is an air layer, which is different from the dielectric substance 28 of the package body 10, the electromagnetic field is scarcely radiated to the upper part.

As shown in FIGS. 6 and 7, since internal signals are not radiated to the exterior in the shielded structure where the line is shielded by the dielectric substance 28 and the grounds 25 and 26, the radiation loss becomes small during signal transmission. Since external signals cannot come to the inside, crosstalk may be decreased.

The multi-layer structure like the SMCPW lines 19 and 20 shown in FIGS. 6 and 7 has its characteristics analyzed mainly based on an electromagnetic analysis method. The line widths w3 and w4 of the SMCPW lines 19 and 20 having a characteristic impedance of 50 ohm may be obtained from the electromagnetic analysis result.

Figure 8:
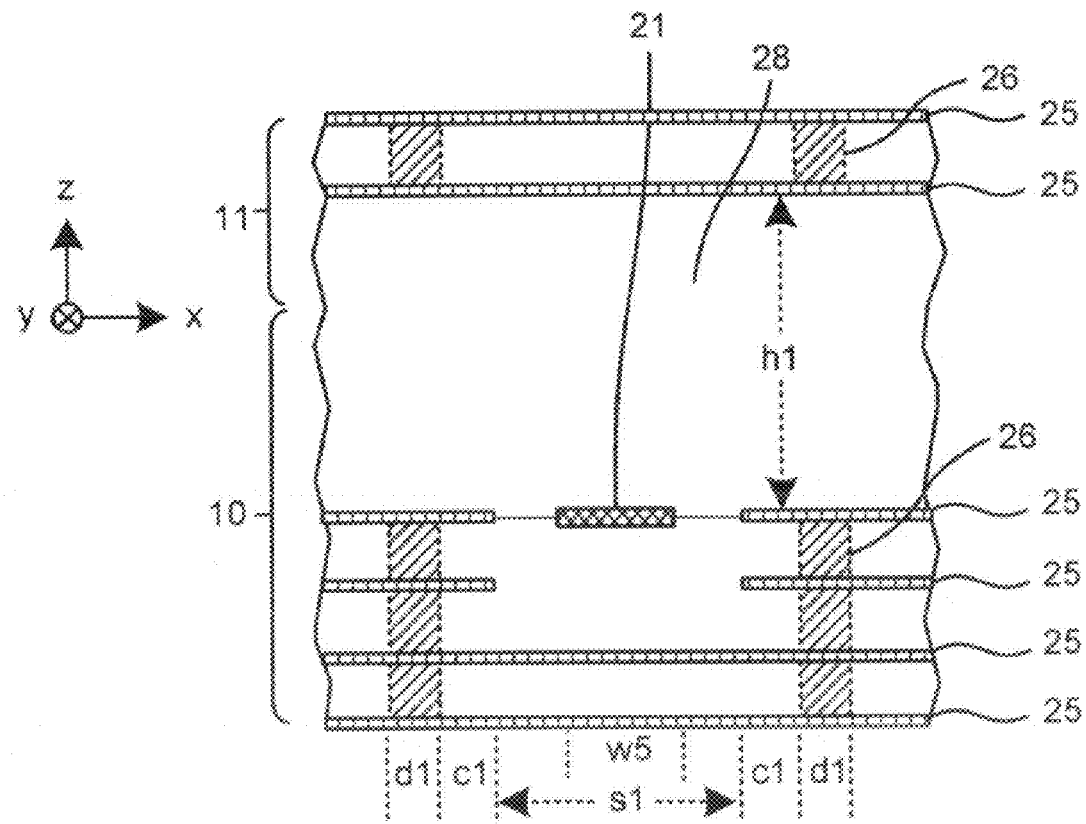
FIG. 8 illustrates a structure of a GCPW line 21 of the first signal transmission unit of the SoP in accordance with the embodiment of the present invention.

FIG. 8 illustrates a structure of a GCPW line 21 of the first signal transmission unit of the SoP in accordance with the embodiment of the present invention.

Referring to FIGS. 1 and 8, h1 of the GCPW line 21 is the height from the integrated circuit 23 to the package cover 11. When the h1 is small, a small SoP is fabricated. However, when the h1 is decreased, the mutual coupling inside the SoP may increase and the gain and isolation of the integrated circuit 23 mounted inside the package may be deteriorated. Therefore, it is required to select an appropriate level of h1 in consideration of these properties. According to an embodiment of the present invention, the h1 at which the performance of the integrated circuit 23 is not deteriorated is 600 μm.

Meanwhile, in the embodiment of the present invention illustrated in FIG. 1, the cavity 30 for mounting the integrated circuit 23 is formed using the package cover 11, the ground surfaces 25, and ground vias 26 to thereby provide a shield from electromagnetic interference. The cavity 30 is filled with a gas different from those in the package body 10 and the dielectric substance 28 of the package cover 11, or helium gas capable of preventing the integrated circuit 23 from being oxidized. The package cover 11 may have a hermetical function to protect the integrated circuit 23 inside the package from the external environment. Resonance may occur in the cavity 30 of FIG. 1. For the integrated circuit 23 inside the cavity 30 to operate, the lowest resonance frequency when the cavity 30 is vacant and the resonance frequency when there is the GCPW line 21 inside the cavity 30 should be taken into consideration. The lowest resonance frequency when the cavity 30 is vacant, which is a TE101 mode frequency $f_c$, and the resonance frequency $f_r$ when there is a microstrip line inside the cavity 30 may be acquired from the following Equations 3 and 4, respectively.

$$f_c = \frac{1}{2\sqrt{\varepsilon_0 \mu_0}} \sqrt{\left(\frac{1}{w}\right)^2 + \left(\frac{1}{L}\right)^2} \quad \text{Eq. 3}$$

$$f_r = f_c \sqrt{1 - \left(\frac{d}{H}\right) + \left(\frac{\varepsilon_r - 1}{\varepsilon_r}\right)} \quad \text{Eq. 4}$$

Equation 4 is a resonance frequency when there is a microstrip line. According to an embodiment of the present invention, an operation frequency when the GCPW line 21 is positioned in the cavity 30.

Figure 9:
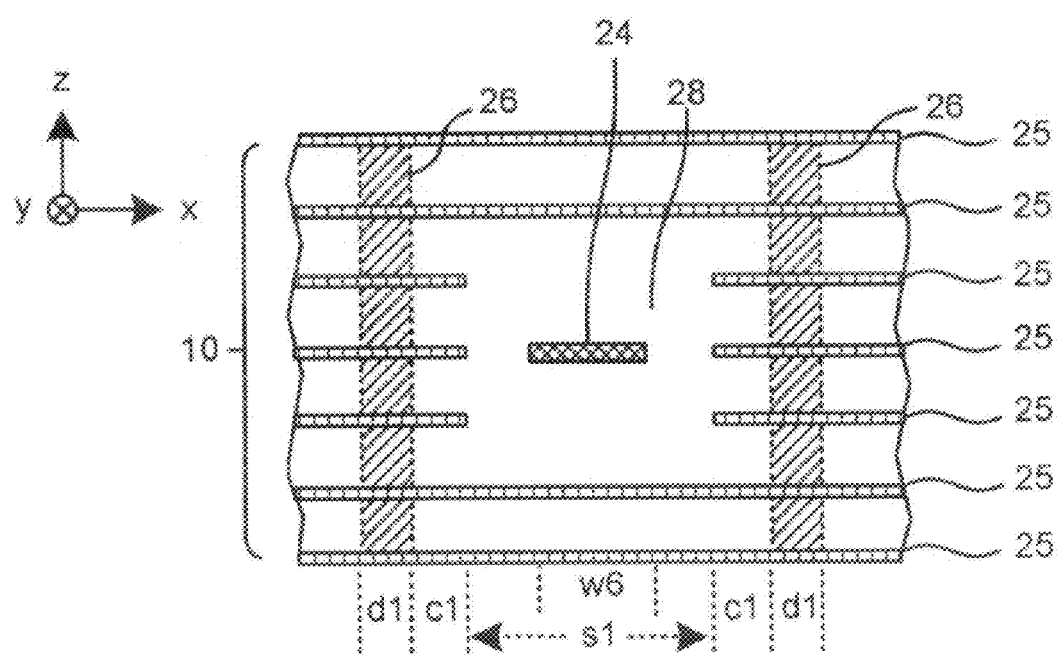
FIG. 9 illustrates a structure of a strip line 24 applicable to the SoP in accordance with the embodiment of the present invention.

FIG. 9 illustrates a structure of a strip line applicable to the SoP in accordance with the embodiment of the present invention.

Referring to FIG. 9, the strip line includes two ground surfaces 25 positioned one over the other in parallel and the space between the two ground surfaces 25 is filled with a dielectric substance 28. At the center of the space filled with the dielectric substance 28, a line having a predetermined width and a predetermined thickness is positioned in parallel to the ground surfaces. The strip line of this structure is a sort of a transmission line.

Referring to FIG. 1, another integrated circuit 23 may be mounted on the right part of the integrated circuit 23 covered with the package cover 11. Herein, the two integrated circuits may be connected through a fourth signal transmission unit to exchange signals between the integrated circuit 23 on the left and the integrated circuit 23 on the right. Herein, the fourth signal transmission unit may include the GCPW line 21 and a strip line 24 shown in FIG. 9. A coupler or a coupled line filter may be formed between the two integrated circuits, and the strip line 24 shown in FIGS. 1 and 9 may be used for the coupler or coupled line filter. The package cover 11 may also be placed on the right integrated circuit 23 as well as the left integrated circuit 23.

Figure 10:
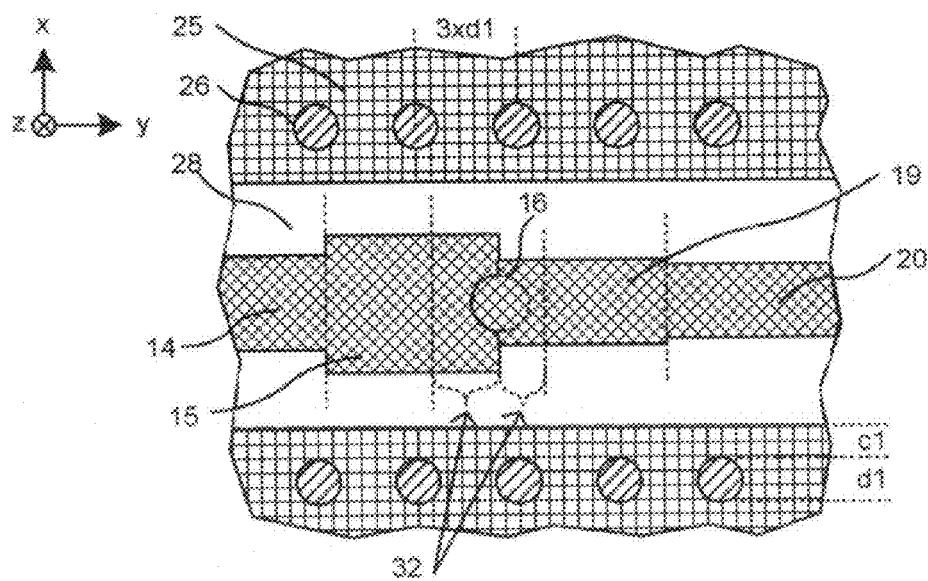
FIG. 10 illustrates a structure of a half-square via pad form between a signal transmission unit and a signal via in the SoP in accordance with the embodiment of the present invention.

FIG. 10 illustrates a coupling structure of a half-square via pad form between a signal transmission unit and a signal via in the SoP in accordance with the embodiment of the present invention.

As described above, the GCPW line 15 and the signal via 16, and the signal via 16 and the SMCPW line 19 are connected in the form of the half-square via pad form. FIG. 10 shows the structure of the half-square via pad form 32.

In general cases, the GCPW line 15 and the SMCPW line 19 are designed to cover the entire circular cross section of the signal via 16, individually. In some cases, they are designed to cover the cross section of the signal via 16 over the cross-sectional edge. In this case, the extra portions of the GCPW line 15 and the SMCPW line 19 which are left behind after covering the signal via 16 come to face each other in parallel, and coupling occurs between lines due to the facing portions.

However, according to the embodiment shown in FIGS. 1 and 10, each of the GCPW line 15 and the SMCPW line 19 is designed to cover only a half of the signal via 16. In this way, the portions of the GCPW line 15 and the SMCPW line 19 that face each other in parallel in a space are not formed and thus the coupling caused in the conventional technology is minimized. This structure is defined as a half-square via pad form 32 in the present invention.

Using the half-square via pad form 32 reduces the undesirable coupling between the GCPW line 15 and the SMCPW line 19 and thus it is possible to realize an ultra wideband SoP having little signal loss.

Figure 11:
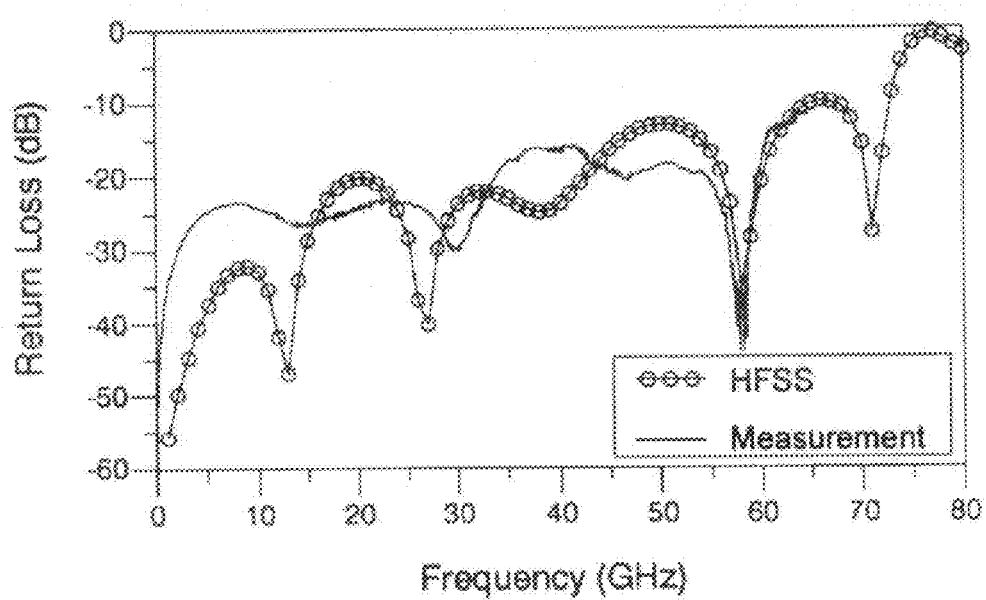
FIG. 11 is a graph showing a return loss characteristic of the SoP in accordance with the embodiment of the present invention.

FIG. 11 is a graph showing a return loss characteristic of the SoP in accordance with the embodiment of the present invention. The drawing shows a return loss characteristic of an SoP according to an embodiment of the present invention by comparing a simulation result using a computer program with actual return loss. The simulation result is analyzed using HFSS, which is an electromagnetic analysis tool produced by the Ansoft company. The simulation result is presented as "HFSS", and the measurement result of the actual return loss is presented as "Measurement" in the FIG. 11. It can be seen from FIG. 11 that the actual return loss measurement result is similar to the simulation result, and the return loss appeared lower than −13 dB in the frequency range of DC [Direct Current] to 70 GHz. This signifies that the SoP of the present invention has excellent signal matching characteristic.

Figure 12:
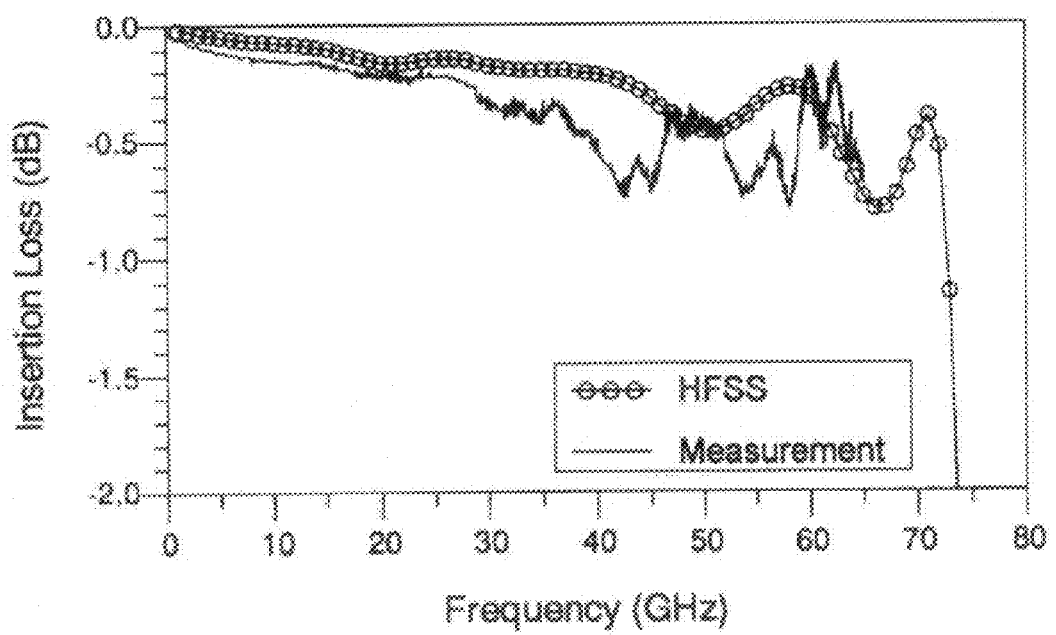
FIG. 12 is a graph showing an insertion loss characteristic of the SoP in accordance with the embodiment of the present invention.

FIG. 12 is a graph showing an insertion loss characteristic of the SoP in accordance with the embodiment of the present invention. The drawing shows an insertion loss characteristic of an SoP suggested in the present invention by comparing a simulation result obtained by using a computer program with an actual insertion loss measurement result. The simulation result was obtained using HFSS, which is an electromagnetic analysis tool produced by the Ansoft company. The actual insertion loss measurement result was presented as "measurement." It can be seen from FIG. 12 that the actual insertion loss measurement result is similar to the simulation result and the insertion loss appeared lower than 0.7 dB in the frequency range of DC to 70 GHz. This signifies that the SoP according to an embodiment of the present invention has little insertion loss.

The SoP according to the embodiments of the present described above can reduce discontinuity of signals occurring in the course of a vertical transition by using a signal via formed of a trough line and a slab line. Also, it can reduce a radiation loss and mutual coupling by using an SMCPW line and decrease the undesired coupling between transition lines by using the half-square via pad. With low return loss and insertion loss, the SoP of the present invention is appropriate for an ultra wideband system.

The technology of the present invention can fabricate an ultra wideband SoP that can transmit ultra broadband signals by minimizing discontinuity of signals appearing during vertical transition that occurs in the course of a signal transmission to/from an external circuit.

While the present invention has been described with respect to the specific embodiments, it will be apparent to those skilled in the art that various changes and modifications may be made without departing from the spirit and scope of the invention as defined in the following claims.

What is claimed is:

1. A System-on-Package (SoP), comprising:
   a package body;
   a first integrated circuit mounted on the package body;
   a first signal transmission unit connected to the first integrated circuit;
   a signal via connected to the first signal transmission unit and including a slab line and a trough line; and
   a second signal transmission unit connected to the signal via.

2. The SoP of claim 1, wherein the first signal transmission unit includes a shielded multilayer coplanar waveguide (SMCPW) line and a grounded coplanar waveguide (GCPW) line.

3. The SoP of claim 1, wherein the second signal transmission unit includes a GCPW line.

4. The SoP of claim 1, wherein the second signal transmission unit includes a third signal transmission unit connected to the second signal transmission unit and an external circuit out of the package body.

5. The SoP of claim 1, further comprising:
   a package cover positioned in an upper end of the first integrated circuit and forming a cavity.

6. The SoP of claim 1, wherein the first signal transmission unit and the second signal transmission unit are connected to the signal via in a half-square via pad form.

7. The SoP of claim 1, further comprising:
   a second integrated circuit mounted on the package body; and
   a fourth signal transmission unit connecting the first integrated circuit with the second integrated circuit,
   wherein the fourth signal transmission unit includes a GCPW line and a strip line.

* * * * *